(12) United States Patent
Ohkubo et al.

(10) Patent No.: US 8,339,182 B2
(45) Date of Patent: Dec. 25, 2012

(54) SEMICONDUCTOR DEVICE

(75) Inventors: Hiroaki Ohkubo, Kanagawa (JP); Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/529,421

(22) Filed: Jun. 21, 2012

(65) Prior Publication Data
US 2012/0262223 A1    Oct. 18, 2012

Related U.S. Application Data

(62) Division of application No. 11/510,639, filed on Aug. 28, 2006, now Pat. No. 8,217,709.

(30) Foreign Application Priority Data

Sep. 7, 2005 (JP) ................................. 2005-259098

(51) Int. Cl.
*H01H 85/00* (2006.01)
(52) U.S. Cl. ...................................................... 327/525
(58) Field of Classification Search .................. None
See application file for complete search history.

(56) References Cited

U.S. PATENT DOCUMENTS

| | | | |
|---|---|---|---|
| 3,533,088 A | 10/1970 | Rapp | |
| 4,714,839 A * | 12/1987 | Chung | ............................ 326/10 |
| 4,721,868 A | 1/1988 | Cornell et al. | |
| 5,034,925 A * | 7/1991 | Kato | ............................ 365/200 |
| 5,231,604 A | 7/1993 | Watanabe | |
| 5,386,386 A * | 1/1995 | Ogihara | ........................ 365/200 |
| 5,959,445 A | 9/1999 | Denham | |
| 6,037,799 A | 3/2000 | McClure | |
| 6,175,261 B1 | 1/2001 | Sundararaman et al. | |
| 6,351,141 B2 | 2/2002 | Mullarkey | |
| 6,353,336 B1 | 3/2002 | Lindley et al. | |
| 6,949,969 B2 | 9/2005 | Mimoto et al. | |
| 7,091,768 B2 * | 8/2006 | Lee | ................................ 327/525 |
| 7,436,729 B2 | 10/2008 | Yoshida et al. | |
| 2004/0046601 A1 | 3/2004 | Jung et al. | |

FOREIGN PATENT DOCUMENTS

| | | |
|---|---|---|
| JP | 11-297837 | 10/1999 |
| JP | 2005-39220 | 2/2005 |
| JP | 2005-57186 | 3/2005 |

OTHER PUBLICATIONS

Randy H. Katz, Contemporary Logic Design, 1994, The Benjamin/Cummings Publishing Company, Inc., pp. 44-45 (no month).

* cited by examiner

*Primary Examiner* — Lincoln Donovan
*Assistant Examiner* — Khareem E Almo
(74) *Attorney, Agent, or Firm* — Young & Thompson

(57) ABSTRACT

A semiconductor device includes a signal output unit, and a decision unit. The signal output unit includes m ($\geq 2$) pieces of fuses, a NAND gate, resistance elements, and an output terminal. The decision unit decides whether n or more pieces (m$\geq$n$\geq$2) of fuses are disconnected out of the m pieces of fuses included in the signal output unit, and outputs the result of a decision. When m=n=2, the decision unit is constituted of a NOR gate having two input terminals connected to a respective end of the fuses. Thus, a H-level potential signal is output at an output terminal of the NOR gate when the decision result is affirmative. On the other hand, when the decision result is negative, a L-level potential signal is output at the output terminal.

8 Claims, 7 Drawing Sheets

SEMICONDUCTOR DEVICE

CROSS REFERENCE TO RELATED APPLICATIONS

This application is a division of co-pending application Ser. No. 11/510,639 filed on Aug. 28, 2006, which claims foreign priority to Japanese Application No. 2005-259098 filed on Sep. 7, 2005. The entire content of each of these applications is hereby expressly incorporated by reference.

BACKGROUND

1. Technical Field

The present invention relates to a semiconductor device.

2. Related Art

Semiconductor devices so far developed include those disclosed in JP-A No. H11-297837, JP-A No. 2005-39220, and JP-A No. 2005-57186. Those semiconductor devices include a fuse. In such semiconductor devices, disconnecting the fuse enables some operations such as adjusting a resistance employed in the semiconductor device and invalidating a defective element to substitute with a normal element. The technique of substituting a defective element with a normal element is utilized, for example, for securing redundancy of a semiconductor storage unit.

Methods of disconnecting the fuse include laser irradiation and loading a current. The former is disclosed in JP-A No. H11-297837, and the latter in JP-A No. 2005-39220 and JP-A No. 2005-57186.

FIG. 7 is a circuit diagram of the semiconductor device according to JP-A No. H11-297837. FIG. 7 shows a signal output unit 100 that outputs a binary signal depending on the disconnection status of the fuse, and an internal circuit 110 which is the object of substitution. The signal output unit 100 includes three fuses 101, 102, and 103, so that a NAND gate 107 outputs a high level (hereinafter, H-level) signal when at least one of the fuses 101, 102, and 103 is disconnected. Specifically, each of the fuses 101, 102, and 103 has an end connected to a power supply terminal 108, and the other end connected to an input terminal of the NAND gate 107. Also, the other ends of the fuses 101, 102, and 103 are grounded via a pull-down resistance 104, 105, and 106, respectively.

In the internal circuit 110, the output of the NAND 107 is provided to transfer gates 112 and 113 via an inverter 111. Thus, two address buses 114 and 115 are mutually switched according to the output of the NAND 107.

In the circuit shown in FIG. 7, the desired result from disconnecting the fuse (for example, substitution of the defective element with the normal element) can be obtained, if at least one of the three fuses 101, 102, and 103 is disconnected. Accordingly, there is less likelihood that incomplete disconnection of the fuses 101, 102, and 103 affects the output of the signal output unit 100. In other words, the complete disconnection of the fuse is substantially further assured.

However, the fuse once disconnected may be reconnected with the lapse of time. Accordingly, reducing the likelihood that such change over time affects the output of the signal output unit is also essential in providing a reliable semiconductor device.

SUMMARY OF THE INVENTION

According to the present invention, there is provided a semiconductor device comprising: a signal output unit including m pieces (where $m \geq 2$) of fuses provided on a semiconductor substrate and an output terminal that outputs a binary signal depending on a disconnection status of the m pieces of fuses; and a decision unit that decides whether n or more pieces (where $m \geq n \geq 2$) of fuses are disconnected out of the m pieces of fuses, and outputs a result of the decision.

The semiconductor device thus constructed includes the decision unit. The decision unit decides whether n or more pieces of fuses are disconnected. Here, when the probability of reconnection of one of the fuses due to the change over time is denoted by p ($0<p<1$), the probability of reconnection of all the n pieces of fuses is $p^n$. Accordingly, when the decision unit outputs a negative result (i.e. when less than n pieces of fuses are disconnected), executing the disconnection again to ensure that n or more pieces of fuses are disconnected reduces the probability that the change over time affects the output of the signal output unit. In other words, the probability of the change over time of the fuse is substantially reduced.

According to the present invention, there is also provided a semiconductor device comprising: a signal output unit including m pieces (where $m \geq 2$) of antifuses provided on a semiconductor substrate and an output terminal that outputs a binary signal depending on a connection status of the m pieces of antifuses; and a decision unit that decides whether n or more pieces (where $m \geq n \geq 2$) of antifuses are connected out of the m pieces of antifuses, and outputs a result of the decision.

The antifuse may, as with the fuse, be disconnected again because of the change over time, though once connected. However, the semiconductor device thus constructed includes the decision unit. The decision unit decides whether n or more pieces of antifuses are connected. Here, when the probability of redisconnection of one of the antifuses due to the change over time is denoted by q ($0<q<1$), the probability of redisconnection of all the n pieces of antifuses is $q^n$. Accordingly, when the decision unit outputs a negative result (i.e. when less than n pieces of antifuses are connected), executing the connection again to ensure that n or more pieces of antifuses are connected reduces the probability that the change over time affects the output of the signal output unit.

Thus, the present invention provides a semiconductor device capable of reducing probability of a change over time of a fuse or an antifuse.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
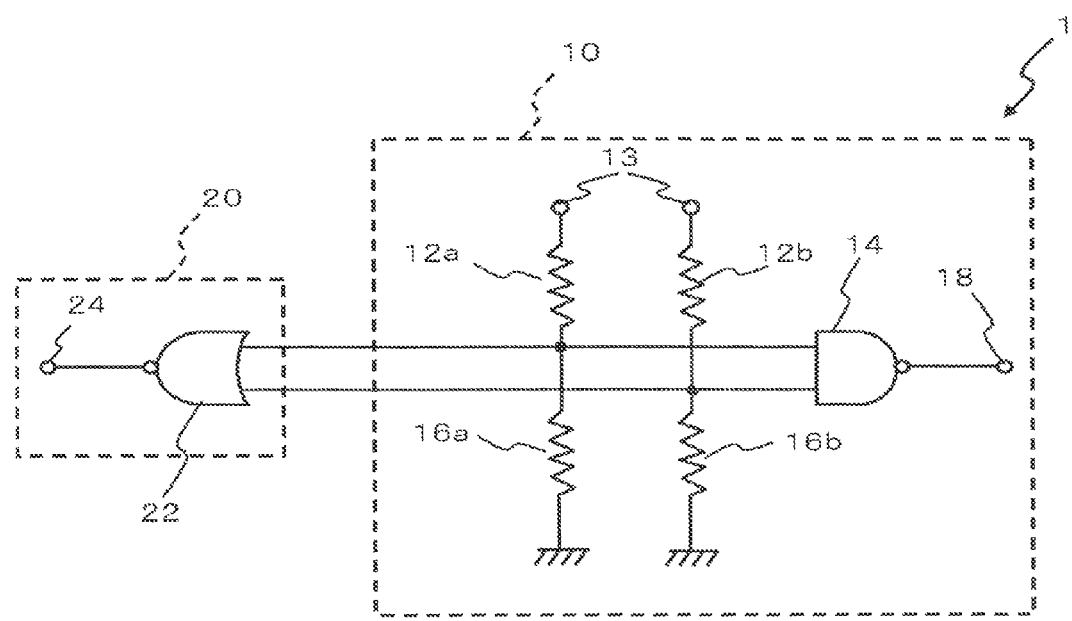
FIG. 1 is a circuit diagram of a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device according to the present invention will be described in details, referring to the accompanying drawings. In the drawings, same constituents are given the identical numerals, and duplicating description will not be repeated.

First Embodiment

FIG. 1 is a circuit diagram of a semiconductor device according to a first embodiment of the present invention. The semiconductor device 1 includes a signal output unit 10 and a decision unit 20. The signal output unit 10 includes m (where m≧2) pieces of fuses 12a and 12b, a NAND gate 14, resistance elements 16a and 16b, and an output terminal 18. In this embodiment, m equals two.

The fuses 12a and 12b are electrical fuses provided on a semiconductor substrate (not shown). To be more detailed, an insulating layer (not shown) is provided on the semiconductor substrate, and the fuses 12a and 12b are disposed on the insulating layer. The fuses 12a and 12b are constituted of a conductive material, and designed so as to be disconnected when a current exceeding a predetermined magnitude runs therethrough. A respective end of the fuses 12a and 12b is connected to a power supply terminal 13. The respective other end of the fuses 12a and 12b is grounded via the resistance elements 16a and 16b (pull-down resistance), and also connected to an input terminal of the NAND gate 14.

Figure 7:
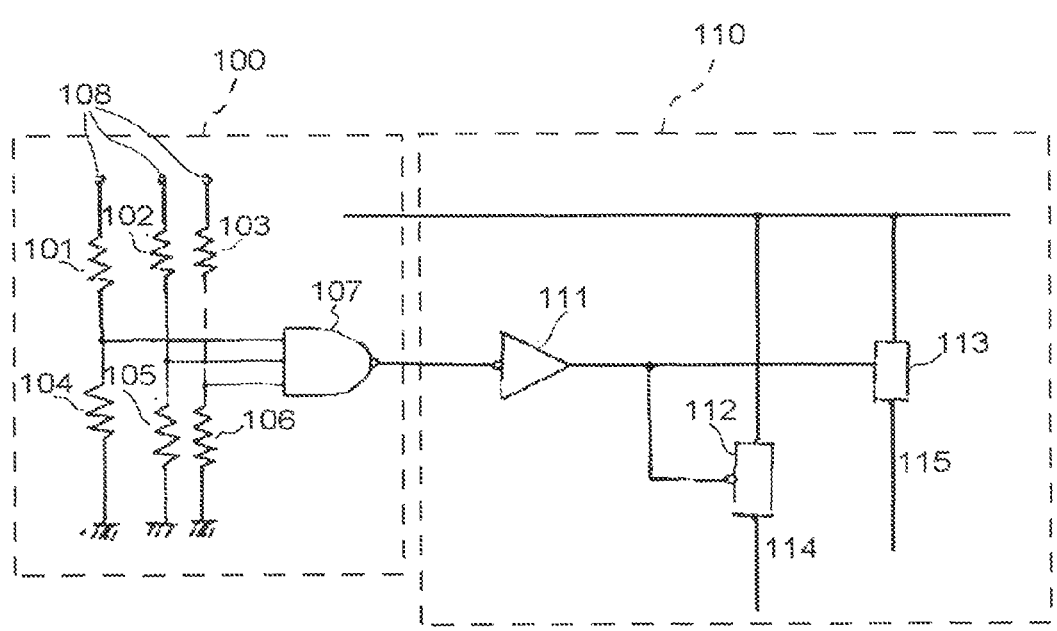
FIG. 7 is a circuit diagram of a conventional semiconductor device.

The output terminal 18 serves to output a binary signal depending on the disconnection status of the two fuses 12a and 12b. Specifically, the output terminal 18 outputs a potential signal of a first magnitude when at least one of the fuses 12a and 12b is disconnected, and outputs a potential signal of a second magnitude when neither of the fuses 12a and 12b is disconnected. In this embodiment, the output terminal 18 corresponds to an output terminal of the NAND gate 14. Accordingly, the output of a H-level and a low level (hereinafter, L-level) signal by the NAND gate 14 corresponds to the potential signal of the first and the second magnitude, respectively. To the output terminal 18, for example the internal circuit 110 as shown in FIG. 7 is connected.

The decision unit 20 decides whether n or more pieces (m≧n≧2) of fuses are disconnected out of the m pieces of fuses included in the signal output unit 10, and outputs a result of the decision. Since m equals two in this embodiment, naturally n also equals two. The decision unit 20 includes a logic gate that receives the potential of the respective ends of the fuses 12a and 12b opposite to the power supply terminal 13 as an input signal, so as to output the result of the decision in a form of an output signal of the logic gate.

In this embodiment, the decision unit 20 is constituted of a NOR gate 22 having two input terminals respectively connected to an end of the fuses 12a and 12b. Accordingly, when the decision result is affirmative, i.e. when the two fuses 12a and 12b are both disconnected, a H-level potential signal is output at an output terminal 24 of the NOR gate 22. In contrast, when the decision result is negative, i.e. when only one of the two fuses 12a and 12b is disconnected or neither of the fuses 12a and 12b is disconnected, a L-level potential signal is output at the output terminal 24.

The semiconductor device 1 offers the following advantageous effects. The semiconductor device 1 includes the decision unit 20. The decision unit 20 decides whether both of the two fuses 12a and 12b are disconnected. Here, when the probability of reconnection of one of the fuses due to the change over time is denoted by p (0<p<1), the probability of reconnection of the two fuses is $p^2$. Accordingly, when the decision unit 20 outputs a negative result (i.e. when less than n pieces of fuses are disconnected), executing the disconnection again to ensure that the two fuses are disconnected reduces the probability that the change over time affects the output of the signal output unit 10. Thus, this embodiment provides the semiconductor device 1 capable of reducing probability of a change over time of the fuse.

The output terminal 18 of the signal output unit 10 outputs the potential signal of the first magnitude when at least one of the fuses 12a and 12b is disconnected, and outputs the potential signal of the second magnitude when neither of the fuses 12a and 12b is disconnected. Such arrangement substantially increases the disconnection probability of the fuse. Thus, the semiconductor device 1 attains both improvement in disconnection probability of the fuse and reduction in probability of a change over time of the fuse.

The decision unit 20 includes the logic gate that receives the potential of the respective ends of the fuses 12a and 12b as an input signal, so as to output the result of the decision in a form of an output signal of the logic gate. Such arrangement provides the decision unit 20 with a simplified configuration, while securing the capability of outputting the affirmative and negative decision result.

The decision unit 20 is constituted of the NOR gate 22 having two input terminals respectively connected to an end of the fuses 12a and 12b. Such configuration further simplifies the structure of the decision unit 20.

In this embodiment, an OR gate may be employed in place of the NOR gate 22. In this case, a L-level signal is output at the output terminal 24 when the decision result is affirmative, and a H-level signal is output when the decision result is negative. Also, when the circuit is configured such that a H-level signal is provided to the input terminal of the NOR gate 22 when the fuses 12a and 12b are disconnected and a L-level signal is provided to the input terminal of the NOR gate 22 when the fuses 12a and 12b are not disconnected, a NAND gate or an AND gate may be employed in place of the NOR gate 22. It should be noted, however, that the NOR gate or the NAND gate is more preferable to the OR gate or the AND gate, from the viewpoint of the simplicity of the circuit configuration.

The fuses 12a and 12b are constituted of an electrical fuse. Accordingly, the fuse 12a and 12b can be disconnected by applying a current. This method is superior to laser irradiation in the following aspects.

When disconnecting the fuse by laser irradiation, a certain interval has to be secured between the disconnection point and other elements, in order to prevent the other elements from being affected by the laser irradiation. This impedes the reduction in dimensions of the semiconductor device. Besides, the formation of the fuse additionally requires one or two exclusive photolithography processes, which incurs an increase in number of manufacturing steps and in manufacturing cost. To be more detailed, since an interlayer film is usually provided on the fuse, an opening for the laser irradiation has to be formed in the interlayer film, and the thickness of the interlayer film on the fuse has to be adjusted. Further, when inspecting the semiconductor device that includes such fuse, the laser irradiation is performed to disconnect the fuse after a characteristic test, and then the semiconductor device has to undergo the characteristic test again. Consequently, the number of manufacturing steps and the manufacturing cost are increased. On the contrary, the disconnection by current does not incur the foregoing drawbacks.

Meanwhile, the present inventors have discovered a problem appropriate to the electrical fuse. Specifically, the present inventors have discovered that a heat treatment performed after the disconnection of the electrical fuse may cause the fuse to be reconnected at the disconnected point. Presumably, this is because the material constituting the electrical fuse is caused to move by an influence of electromigration. Therefore, when the electrical fuse is employed, the present invention provides further advantage because of the capability of reducing the probability that the reconnection affects the output of the signal output unit.

Second Embodiment

Figure 2:
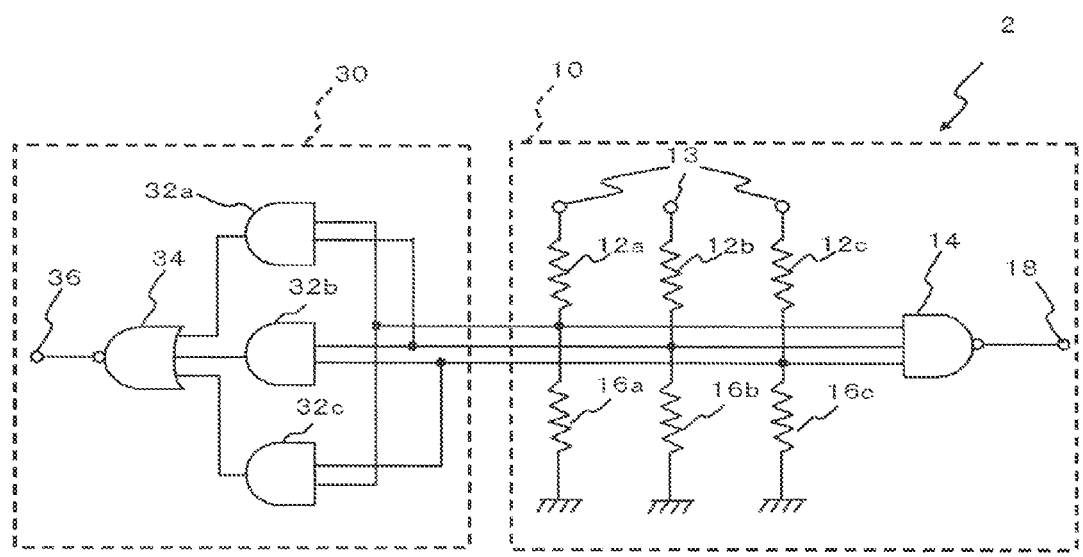
FIG. 2 is a circuit diagram of a semiconductor device according to a second embodiment of the present invention.

FIG. 2 is a circuit diagram of a semiconductor device according to a second embodiment of the present invention. The semiconductor device 2 includes the signal output unit 10 and a decision unit 30. The signal output unit 10 includes m (where m≧2) pieces of fuses 12a, 12b, and 12c, the NAND gate 14, resistance elements 16a, 16b, and 16c, and the output terminal 18. In this embodiment, m equals three.

The fuses 12a, 12b, and 12c are similarly configured to those described referring to FIG. 1. A respective end of the fuses 12a, 12b, and 12c is connected to the power supply terminal 13. The respective other end of the fuses 12a, 12b, and 12c is grounded via the resistance elements 16a, 16b, and 16c, and also connected to the input terminal of the NAND gate 14.

The output terminal 18 serves to output a binary signal depending on the disconnection status of the three fuses 12a, 12b, and 12c. Specifically, the output terminal 18 outputs a potential signal of a first magnitude when at least one of the fuses 12a, 12b, and 12c is disconnected, and outputs a potential signal of a second magnitude when none of the fuses 12a, 12b, and 12c is disconnected.

The decision unit 30 decides whether n or more pieces (m≧n≧2) of fuses are disconnected out of the m pieces of fuses included in the signal output unit 10, and outputs the decision result. Here, n is assumed to be two as an example. The decision unit 30 includes a logic gate that receives the potential of the respective ends of the fuses 12a, 12b, and 12c as an input signal, so as to output the result of the decision in a form of an output signal of the logic gate.

In this embodiment, the decision unit 30 is constituted of three AND gates 32a, 32b, and 32c and a NOR gate 34. The AND gate 32a (first AND gate) includes two input terminals respectively connected to an end of the fuse 12a (first fuse) and the fuse 12b (second fuse). The AND gate 32b (second AND gate) includes two input terminals respectively connected to an end of the fuse 12b and the fuse 12c (third fuse). The AND gate 32c (third AND gate) includes two input terminals respectively connected to an end of the fuse 12c and the fuse 12a. The NOR gate 34 includes three input terminals connected to the output terminal of the AND gates 32a, 32b, and 32c, respectively.

Accordingly, when the decision result is affirmative, i.e. when two or more fuses are disconnected out of the fuses 12a, 12b, and 12c, a L-level signal is output by the AND gate 32a, 32b, and 32c, and a H-level potential signal is output at an output terminal 36 of the NOR gate 34. In contrast, when the decision result is negative, i.e. when none or only one of the fuses 12a, 12b, and 12c is disconnected, a L-level potential signal is output at the output terminal 36.

In the semiconductor device 2 thus constructed also, since the decision unit 30 decides whether two or more fuses out of the fuses 12a, 12b, and 12c are disconnected, the probability of the change over time of the fuse can be reduced, as in the semiconductor device 1.

The decision unit 30 is constituted of the three AND gates 32a, 32b, and 32c and the NOR gate 34. Such arrangement provides the decision unit 30 with a simplified configuration, while securing the capability of deciding whether two or more fuses are disconnected out of the three fuses.

Figure 3:
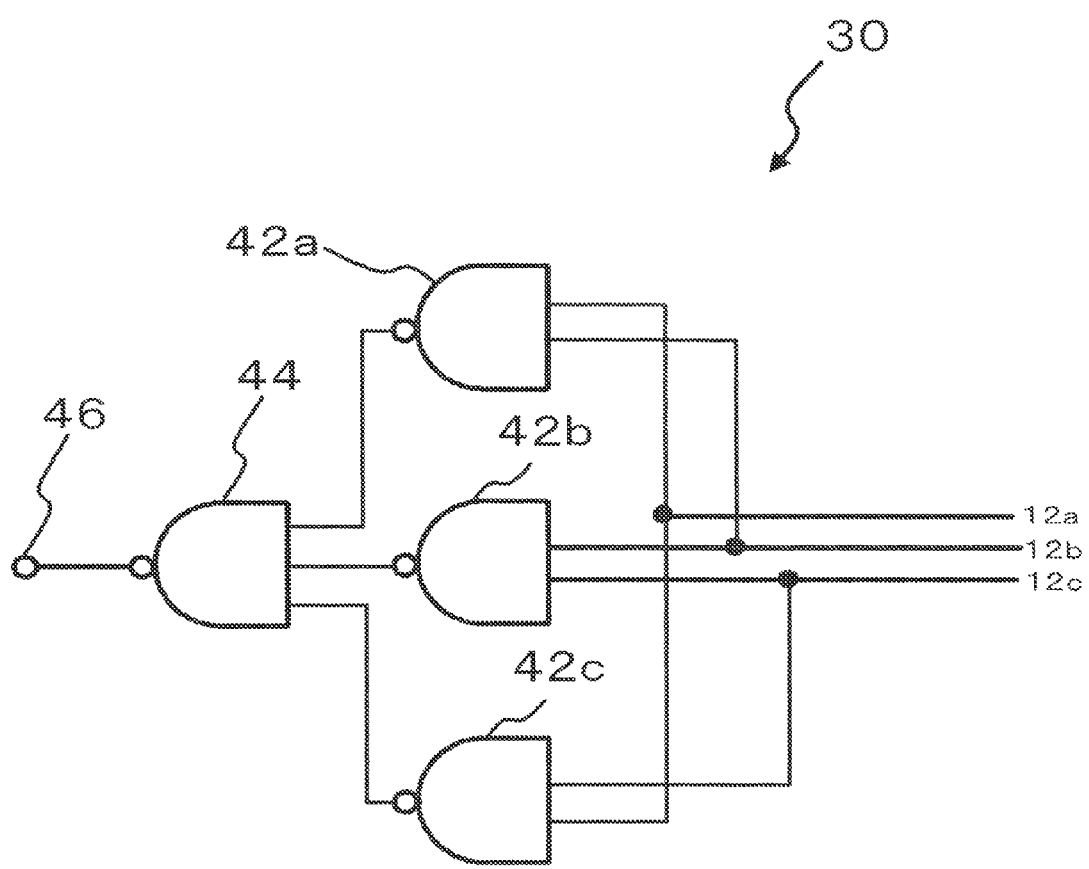
FIG. 3 is a circuit diagram of a variation of the decision unit in the semiconductor device of FIG. 2.

Here, the decision unit 30 may be configured in various other ways without limitation to FIG. 2. To cite a few examples, as shown in FIG. 3, the decision unit 30 may include a NAND gate 42a (first NAND gate) having two input terminals respectively connected to an and of the fuses 12a, 12b, a NAND gate 42b (second NAND gate) having two input terminals respectively connected to an and of the fuses 12b, 12c, a NAND gate 42c (third NAND gate) having two input terminals respectively connected to an and of the fuses 12c, 12a, and a NAND gate 44 (fourth NAND gate) having three input terminals respectively connected to the output terminal of the NAND gates 42a, 42b, and 42c. Such configuration further simplifies the structure of the decision unit 30, because of including only the NAND gates.

Figure 4:
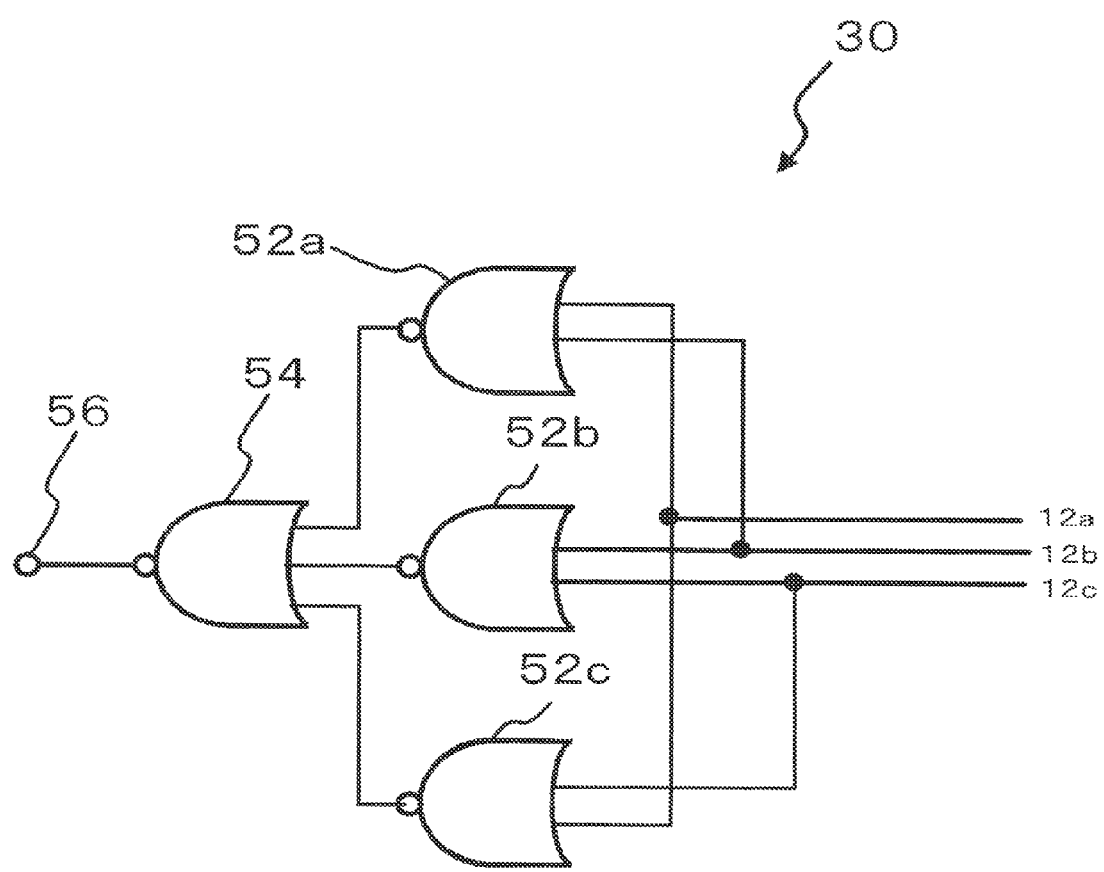
FIG. 4 is a circuit diagram of another variation of the decision unit in the semiconductor device of FIG. 2.

Alternatively, as shown in FIG. 4, the decision unit 30 may include a NOR gate 52a (first NOR gate) having two input terminals respectively connected to an and of the fuses 12a, 12b, a NOR gate 52b (second NOR gate) having two input terminals respectively connected to an and of the fuses 12b, 12c, a NOR gate 52c (third NOR gate) having two input terminals respectively connected to an and of the fuses 12c, 12a, and a NOR gate 54 (fourth NOR gate) having three input terminals respectively connected to the output terminal of the NOR gates 52a, 52b, and 52c. In this case also, the structure of the decision unit 30 is further simplified, because of including only the NOR gates.

Here, in FIGS. 3 and 4, a L-level potential signal is respectively output at the output terminal 46, and 56 when the decision result is affirmative, and a H-level potential signal is respectively output at the output terminal 46, and 56 when the decision result is negative. Other advantages of the semiconductor device 2 are as described with respect to the semiconductor device 1.

Figure 5:
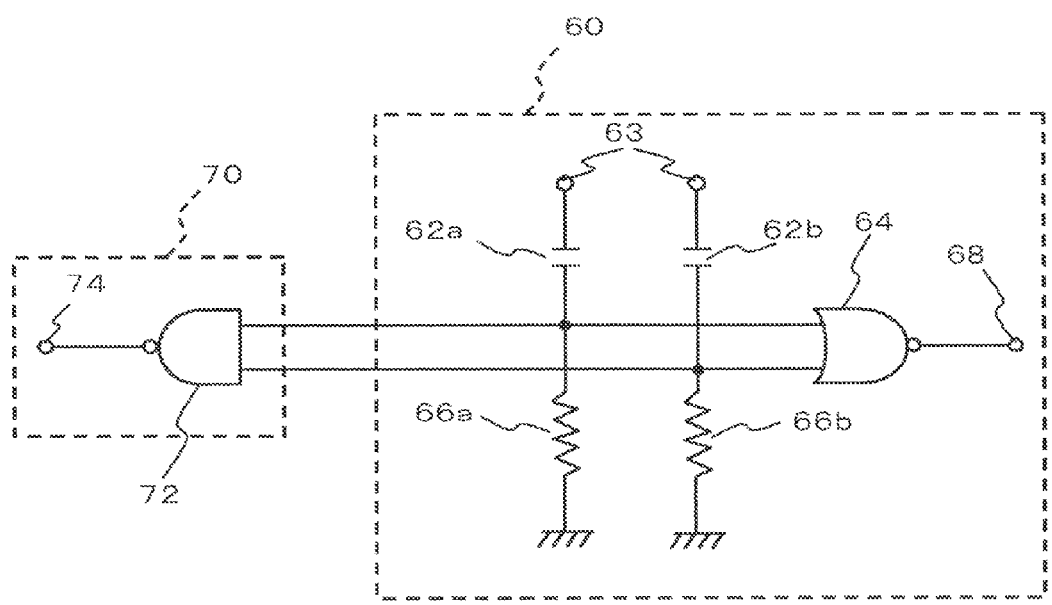
FIG. 5 is a circuit diagram of a variation of the semiconductor device according to the embodiment.

The semiconductor device according to the present invention is not limited to the foregoing embodiments, but various modifications may be made. To cite a few examples, the fuse may be substituted with an antifuse in those embodiments. FIG. 5 is a circuit diagram of a semiconductor device including the antifuse. In FIG. 5, a signal output unit 60 includes m (2) pieces of antifuses 62a, 62b provided on the semiconductor substrate, a NOR gate 64, resistance elements 66a, 66b, and an output terminal 68. In this variation, m equals two. The output terminal 68 outputs a potential signal of a first magnitude when at least one of the antifuses 62a, 62b is connected, and outputs a potential signal of a second magnitude when neither of the antifuses 62a, 62b is connected.

The decision unit 70 decides whether n or more pieces (m≧n≧2) of fuses are connected out of the m pieces of fuses included in the signal output unit 60, and outputs the decision result. Since m equals two, naturally n also equals two. In this variation, the decision unit 70 is constituted of a NAND gate 72 having two input terminals respectively connected to an end of the antifuses 62a, 62b. Accordingly, when the decision result is affirmative, i.e. when the two antifuses 62a, 62b are both connected, a L-level potential signal is output at an output terminal 74 of the NAND gate 72. In contrast, when the decision result is negative, i.e. when only one or none of the two antifuses 62a, 62b is connected, a H-level potential signal is output at the output terminal 74.

Figure 6:
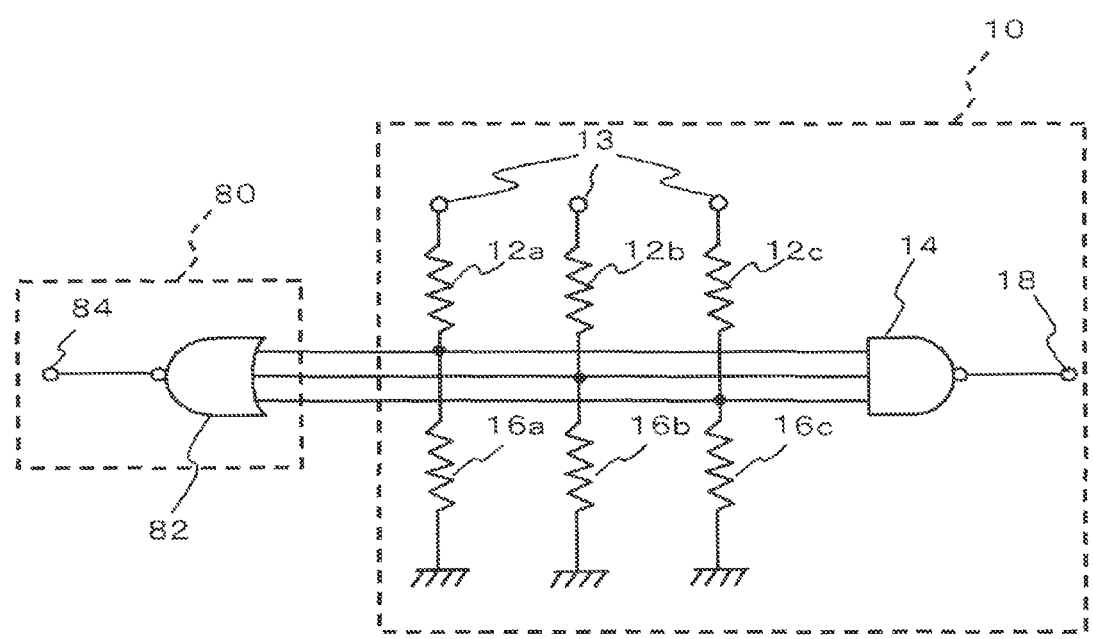
FIG. 6 is a circuit diagram of another variation of the semiconductor device according to the embodiment.

Also, while the foregoing embodiments refer to the case where (m, n) is (2, 2) or (3, 2), m and n may be any integer as long as the relation of m≧n≧2 is satisfied. FIG. 6 shows a circuit diagram representing the case of m=n=3 as an example. In FIG. 6, the signal output unit 10 is similarly configured to that shown in FIG. 2. Also, a decision unit 80 is constituted of a NOR gate 82 having three input terminals respectively connected to an end of the fuses 12a, 12b, and 12c. At an output terminal 84 of the NOR gate 82, a H-level and a L-level potential signal is output when the decision result is affirmative and negative, respectively. As is apparent from FIG. 6 as well as from FIG. 1, the decision unit may be generally constituted of a NOR gate having m pieces of input terminals respectively connected to an end of m pieces of fuses, when m equals n.

Further, although the electrical fuse is employed in the foregoing embodiments, a fuse that can be disconnected by laser irradiation may be employed.

It is apparent that the present invention is not limited to the above embodiment, and may be modified and changed without departing from the scope and spirit of the invention.

What is claimed is:

1. A semiconductor device, comprising:
a first unit including a first input terminal and a second input terminal;
a second unit including a third input terminal and a fourth input terminal;
a first wire connected to the first input terminal and the third input terminal;
a second wire connected to the second input terminal and the fourth input terminal;
a first fuse connected to the first wire; and
a second fuse connected to the second wire, wherein
both the first fuse and the second fuse are blown,
the first unit outputs a first signal if both the first fuse and the second fuse are blown,
the first unit outputs a second signal if neither the first fuse nor the second fuse is blown or if one of the first fuse and the second fuse is not blown,
the second signal is at a different level from the first signal,
the second unit outputs a third signal if both the first fuse and the second fuse are blown or if one of the first fuse and the second fuse is blown,
the second unit outputs a fourth signal if neither the first fuse nor the second fuse is blown, and
the fourth signal is at a different level from the third signal.

2. The semiconductor device according to claim 1, wherein the first unit is a NOR gate, and the second unit is a NAND gate.

3. The semiconductor device according to claim 2, wherein the first wire is grounded if the first fuse is blown, and the second wire is grounded if the second fuse is blown.

4. A semiconductor device, comprising:
a first unit including a first input terminal and a second input terminal;
a second unit including a third input terminal and a fourth input terminal;
a first wire connected to the first input terminal and the third input terminal;
a second wire connected to the second input terminal and the fourth input terminal;
a first antifuse connected to the first wire; and
a second antifuse connected to the second wire, wherein
both the first antifuse and the second antifuse are blown,
the first unit outputs a first signal if both the first antifuse and the second antifuse are blown,
the first unit outputs a second signal if neither the first antifuse nor the second antifuse is blown or if one of the first antifuse and the second antifuse is not blown,
the second signal is at a different level from the first signal,
the second unit outputs a third signal if both the first antifuse and the second antifuse are blown or if one of the first antifuse and the second antifuse is blown,
the second unit outputs a fourth signal if neither the first antifuse nor the second antifuse is blown, and
the fourth signal is at a different level from the third signal.

5. The semiconductor device according to claim 4, wherein the first unit is a NAND gate, and the second unit is a NOR gate.

6. The semiconductor device according to claim 5, wherein the first wire is grounded if the first antifuse is not blown, and the second wire is grounded if the second antifuse is not blown.

7. A semiconductor device, comprising:
a NOR gate including a first input terminal and a second input terminal;
a NAND gate including a third input terminal and a fourth input terminal;
a first wire connected to the first input terminal and the third input terminal;
a second wire connected to the second input terminal and the fourth input terminal;
a first fuse connected to the first wire; and
a second fuse connected to the second wire, wherein both the first fuse and the second fuse are blown.

8. A semiconductor device, comprising:
a NOR gate including a first input terminal and a second input terminal;
a NAND gate including a third input terminal and a fourth input terminal;
a first wire connected to the first input terminal and the third input terminal;
a second wire connected to the second input terminal and the fourth input terminal;
a first antifuse connected to the first wire; and
a second antifuse connected to the second wire, wherein both the first antifuse and the second antifuse are blown.

* * * * *